Figure 1:
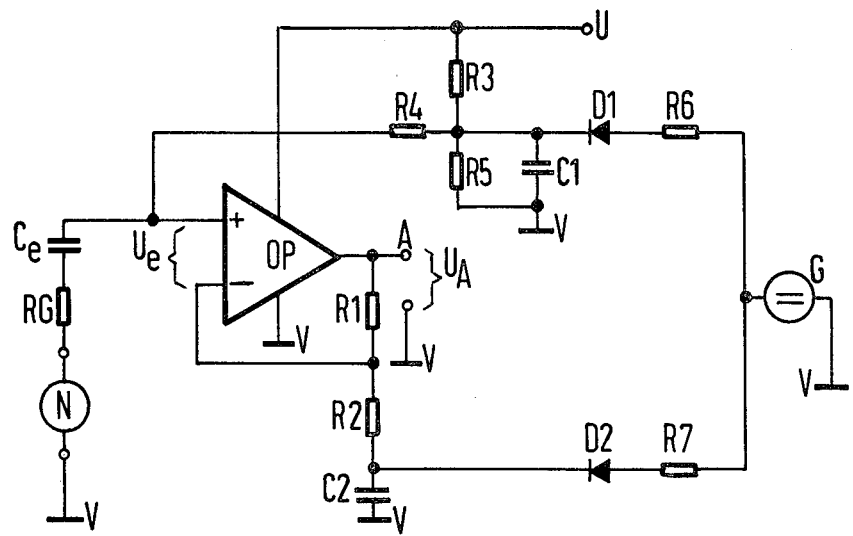

United States Patent [19]

Mündel et al.

[11] 4,441,040
[45] Apr. 3, 1984

[54] INTEGRABLE SEMICONDUCTOR CIRCUIT WITH A NEGATIVELY FED-BACK, NON-INVERTING OPERATIONAL AMPLIFIER

[75] Inventors: Gerald Mündel, Glonn; Michael Lenz, Munich, both of Fed. Rep. of Germany

[73] Assignee: Siemens Aktiengesellschaft GmbH, Berlin and Munich, Fed. Rep. of Germany

[21] Appl. No.: 359,526

[22] Filed: Mar. 18, 1982

[30] Foreign Application Priority Data

Apr. 7, 1981 [DE] Fed. Rep. of Germany ....... 3114042

[51] Int. Cl.³ .................... H03K 17/74; G06G 7/10
[52] U.S. Cl. ................................. 307/491; 307/494; 307/503
[58] Field of Search ............... 307/490, 491, 494, 503

[56] References Cited

U.S. PATENT DOCUMENTS 4,236,126 11/1980 Wollor et al. ................ 307/491
4,398,104 8/1981 Podhrasky .................... 307/490

OTHER PUBLICATIONS

Siemens Datenbuch, pp. 556 and 557, 1980/81.

Primary Examiner—Stanley D. Miller
Assistant Examiner—B. P. Davis
Attorney, Agent, or Firm—Herbert L. Lerner; Laurence A. Greenberg

[57] ABSTRACT

Integrable semiconductor circuit, including a negatively fed-back non-inverting operational amplifier, a first resistor connected between the signal output and the inverting input of the amplifier, a second resistor connected to the inverting input, first and second capacitors, the second capacitor being connected between the second resistor and reference potential, forming a voltage divider including the first and second resistors and the second capacitor connected between reference potential and the output of the amplifier with a first circuit point disposed between the second resistor and the second capacitor connecting the inverting input of the operational amplifier to reference potential, an operating potential source connected to one of the supply inputs of the amplifier and the other supply input being connected to reference potential together supplying the amplifier with a supply voltage, series-connected resistors having a second circuit point disposed therebetween, the resistors being connected between the operating potential source and the non-inverting input, a fifth resistor connected between the second circuit point and reference potential, and the first capacitor being connected in parallel with the fifth resistor, comprising an auxiliary d-c voltage source having a first pole connected to reference potential, first and second diodes each having an anode connected to the second pole of the d-c voltage source, one of the series-connected resistors being additionally connected between the cathode of the first diode and the non-inverting input of the amplifier, and the cathode of the second diode being connected to the first circuit point.

4 Claims, 3 Drawing Figures

INTEGRABLE SEMICONDUCTOR CIRCUIT WITH A NEGATIVELY FED-BACK, NON-INVERTING OPERATIONAL AMPLIFIER

The invention relates to an integrable semiconductor circuit with a negatively fed-back, non-inverting operational amplifier, the signal output of the operational amplifier being connected to the inverting input through a resistor, and this inverting input being connected to a capacitor through a resistor, this capacitor being connected to reference potential in such a way that the capacitor together with both resistors forms a voltage divider between the reference potential and the output of the operational amplifier, because of which besides the operating potential supplying the operational amplifier with the supply voltage along with the reference potential, the operating potential is connected not only to the supply input of the operational amplifier but also to the non-inverting signal input thereof through two series-connected resistors, while a circuit point between the lastmentioned resistors is connected to the reference potential through another resistor being connected in parallel with another capacitor.

A low or audio-frequency amplifier having these features is described in the "Siemens Datenbuch (Siemens Data Book) 1980/81" Integrated Circuits For Entertainment Electronics, pages 556 and 557.

With OP (operational amplifier) circuits of the above defined type, an easily triggered overshoot of the output voltage has been observed, since with amplifiers being negatively fed-back by resistors and capacitors, the selection of time constants is the key factor as to whether the OP output voltage responds to the switching-in of the supply voltage in a stable or unstable manner. Another factor to be taken into account is that the internal resistance RG of the signal source N, which controls the OP signal input, together with the coupling capacitance $C_e$, determines the input time constant.

For eliminating any overshoots at the signal output A of the operational amplifier by providing external amplifier circuitry, only a narrowly limited tolerance range for the internal resistance RG of the amplifier controlling source, and only a minimal value for the coupling capacitance $C_e$ are available. The other option based on the present state of the art is to develop the negative feedback branch to the point, where the time constant is zero which, however, has the drawback of co-amplifying the offset voltage.

It is accordingly an object of the invention to provide an integrable semiconductor circuit with a negatively fed-back, non-inverting operational amplifier, which overcomes the hereinafore-described disadvantages of the heretofore-known devices of this general type, and to avoid the overshoot problem and still maintain the advantages of a feedback with a time constant.

With the foregoing and other objects in view there is provided, in accordance with the invention, an integrable semiconductor circuit, including a negatively, reverse or degenerative by, fed-back non-inverting operational amplifier having a signal output, an inverting and noninverting signal input and supply inputs, a first resistor connected between the signal output and the inverting input of the operational amplifier, a second resistor being connected to the inverting input of the operational amplifier and to the output of the operational amplifier through the first resistor, first and second capacitors, the second capacitor being connected between the second resistor and reference potential, forming a voltage divider including the first and second resistors and the second capacitor connected between reference potential and the output of the operational amplifier with a first circuit point disposed between the second resistor and the second capacitor connecting the inverting input of the operational amplifier to reference potential, an operating potential source being connected to one of the supply inputs of the operational amplifier and the other supply input being connected to reference potential together supplying the operational amplifier with a supply voltage, series-connected third and fourth resistors having a second circuit point disposed therebetween, the series-connected third and fourth resistors being connected between the operating potential source and the non-inverting input of the operational amplifier, a fifth resistor connected between the second circuit point and reference potential, and the first capacitor being connected in parallel with the fifth resistor, wherein the improvement comprises an auxiliary d-c voltage source having a first pole connected to reference potential and a second pole, first and second diodes each having an anode connected to the second pole of the auxiliary d-c voltage source and a cathode, one of the series-connected third and fourth resistors connected between the supply potential source and the non-inverting input of the operational amplifier being additionally connected between the cathode of the first diode and the non-inverting input of the operational amplifier, and the cathode of the second diode being connected to the first circuit point.

In accordance with another feature of the invention, there are provided sixth and seventh resistors each being respectively connected between one of the diodes and the second pole of the auxiliary d-c voltage source charging the diodes.

In accordance with a further feature of the invention, the sixth (R6) and seventh (R7) resistors connected between the diodes and the auxiliary d-c voltage source are tuned to the respective one of the first (C1) and second (C2) capacitors connected to the cathodes of the diodes in such a way that the condition (R6·C1)>(R7·C2)

is satisfied.

In accordance with a concomitant feature of the invention, the resistors form a higher resistance between the supply voltage and the cathode of the first diode than between the anode of the first diode and the auxiliary d-c voltage source.

Other features which are considered as characteristic for the invention are set forth in the appended claims.

Although the invention is illustrated and described herein as embodied in an integrable semiconductor circuit with a negatively fed-back, non-inverting operational amplifier, it is nevertheless not intended to be limited to the details shown, since various modifications and structural changes may be made therein without departing from the spirit of the invention and within the scope and range of equivalents of the claims.

Figure 2:
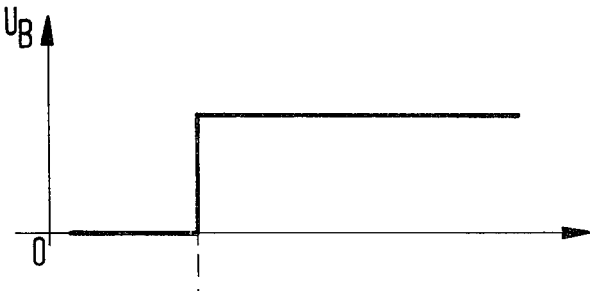
Figure 3:
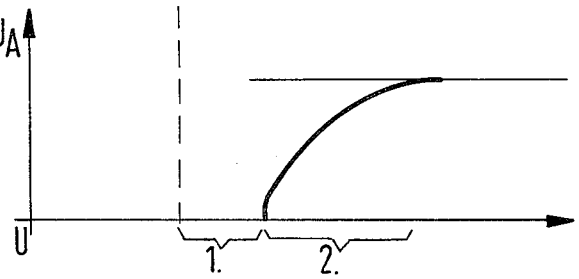

The construction and method of operation of the invention, however, together with additional objects and advantages thereof will be best understood from the following description of specific embodiments when read in connection with the accompanying drawings, in which:

FIG. 1 is a schematic circuit diagram of a circuit according to the invention; and FIGS. 2 and 3 are each time diagrams for bringing an understanding of the effectiveness of the circuit according to the invention.

The notable fact is that the presently known a-c voltage divider is brought about by the initially summerized series-connection of a resistor with a capacitor, by which the inverting OP amp (operational amplifier) input and the reference potential are interconnected.

Referring now to the figures of the drawing and first particularly to FIG. 1 thereof, there is seen a circuit diagram of an amplifier circuit according to the invention, which is constructed in the known manner for such circuitry with an operational amplifier OP (see, e.g., Tietze and Schenk, "Semiconductor Circuit Engineering", (1980), pages 107–112) that has one grounded supply terminal, i.e., connected to a reference potential V, and has its other terminal connected to an operating potential U, which together with the reference potential V defines the circuit supply voltage. The non-inverting input of the operational amplifier is designated with reference symbol "+" and forms the first input terminal for the input signal, while the second input connection is formed by the supply connection to be charged with the reference potential V.

The output A of the operational amplifier OP simultaneously forms the signal output of the circuit. The output A is connected to the inverting input "−" of the operational amplifier through a negative feedback resistor R1, and is additionally connected to the terminal for the reference potential V through a further resistor R2 and capacitor C2 connected in series therewith. Thus in effect the inverting input "−" of the operational amplifier OP is applied to the reference potential V through an a-c voltage divider R2, C2.

A switching point between both components of the a-c voltage divider R2, C2 is connected to the cathode of a diode D2, the anode thereof being connected to one pole of an auxiliary voltage source G through a resistor R7. Using the same pole, this auxiliary voltage source G, which supplies a d-c voltage $U_H$ still to be defined, is additionally connected to the anode of a second diode D1 through a resistor R6, while its other pole is applied to the supply terminal to be charged by the reference potential V.

The cathode of the last-mentioned diode D1 is connected through the resistor R5 and through a parallel-connected capacitor C1 to the reference potential V, and is connected to the supply terminal supplying the operating potential U through a resistor R3, as well as to the signal input "+" of the operational amplifier OP and the terminal carrying the reference potential V through a resistor R4. With respect to the following observations made on the operation of this circuit, it is in the form of a series-connection of a coupling capacitance $C_e$, an internal resistance RG of a signal source, and signal voltage N.

The key factor in operating the improved suggested embodiment according to the invention for an amplifier circuit according to the initally mentioned description, is that the switching-in process of the amplifier circuit is subdivided into two time intervals.

During the first time interval the capacitors C1 and C2 determining the time constant are so rapidly pre-charged that the output A cannot overshoot. During the second time interval the negative feedback loop including the resistors R1 and R2 is closed, and the output voltage $U_A$ between the output terminal A of the operational amplifier and the supply terminal carrying the reference potential approaches the rest or quiescent voltage output in an aperiodic or highly damped, non-oscillatory manner.

During the first time interval the capacitor C1 is rapidly charged through the resistor R6, and the capacitor C2 is charged through the resistor R7. Under the condition $$(C2 \cdot R7) < (C1 \cdot R6)$$

the input voltage $U_e$ of the operational amplifier OP, i.e. the voltage between the non-inverting input "+" and the inverting input "−" becomes negative. In this way the amplifier output A remains grounded, that is connected through with respect to the reference potential V.

Furthermore, when dimensioning the resistor R4, which connects the supply potential U with the cathode of the diode D1, the capacitance of the capacitor C1 interconnecting this cathode and the reference potential V must also be taken into account to tune both of these orders of magnitude one by one according to the equation $$(R4 \cdot C1) >> (R6 \cdot C1), \text{ that is}$$

$$R4 >> R6$$

i.e., to set the resistance value of the resistor R4 substantially higher than that of the resistor R6.

Through the auxiliary d-c voltage $U_H$ supplied by the auxiliary voltage source G as well as through the operating voltage U subject to charging actions, the amplifier input voltage $U_e$ becomes equal to zero at the end of the first time interval. Subsequently the output voltage $U_A$ approaches the rest or quiescent output voltage in an aperiodic manner.

FIG. 2 shows the per unit time behavior of the supply voltage $U_B$ defined by both potentials U and V, and FIG. 3 shows the behavior of output voltage $U_A$ reached because of the circuit improvement according to the invention. The abscissa shows the associated time values t drawn to the same scale.

In case of an extremely high input resistance, i.e., the internal resistor RG of the signal source, the measures taken according to the invention have the further advantage of enabling the insertion of a smaller coupling capacitor $C_e$, i.e., having a capacitance of less than 200 μF, while otherwise an input coupling capacitance of at least 200 μF is required. Through the use of a lower input coupling capacitance $C_e$, the advantage of the switching-in behavior of the circuit according to the invention being practically independent of the internal resistance RG of the signal generator, is achieved.

The operational amplifier OP can be assembled from npn as well as pnp-transistors.

The foregoing is a description corresponding to German Application No. P 31 14 042.4, dated Apr. 7, 1981, the International priority of which is being claimed for the instant application, and which is hereby made part of this application. Any discrepancies between the foregoing specification and the aforementioned corresponding German application are to be resolved in favor of the latter.

We claim:

1. Integrable semiconductor circuit, including a negatively fed-back non-inverting operational amplifier having a signal output, an inverting and a non-inverting signal input and supply inputs, a first resistor connected between the signal output and the inverting input of the operational amplifier, a second resistor being connected to the inverting input of the operational amplifier and to the output of the operational amplifier through the first resistor, first and second capacitors, the second capacitor being connected between the second resistor and reference potential, forming a voltage divider including the first and second resistors and the second capacitor connected between reference potential and the output of the operational amplifier with a first circuit point disposed between the second resistor and the second capacitor connecting the inverting input of the operational amplifier to reference potential, an operating potential source being connected to one of the supply inputs of the operational amplifier and the other supply input being connected to reference potential together supplying the operational amplifier with a supply voltage, series-connected third and fourth resistors having a second circuit point disposed therebetween, said series-connected third and fourth resistors being connected between the operating potential source and the non-inverting input of the operational amplifier, a fifth resistor connected between the second circuit point and reference potential, and the first capacitor being connected in parallel with the fifth resistor, wherein the improvement comprises an auxiliary d-c voltage source having a first pole connected to reference potential and a second pole, first and second diodes each having an anode connected to said second pole of said auxiliary d-c voltage source and a cathode, one of said series-connected third and fourth resistors connected between the supply potential source and the non-inverting input of the operational amplifier being additionally connected between the cathode of said first diode and the non-inverting input of the operational amplifier, and the cathode of said second diode being connected to said first circuit point.

2. Semiconductor circuit according to claim 1, including sixth and seventh resistors each being respectively connected between one of said diodes and said second pole of said auxiliary d-c voltage source charging said diodes.

3. Semiconductor circuit according to claim 2, wherein said sixth (R6) and seventh (R7) resistors connected between said diodes and said auxiliary d-c voltage source are tuned to the respective one of the first (C1) and second (C2) capacitors connected to the cathodes of said diodes in such a way that the condition $$(R6 \cdot C1) > (R7 \cdot C2)$$

is satisfied.

4. Semiconductor circuit according to claim 2 or 3, wherein said resistors form a higher resistance between the supply voltage and the cathode of said first diode than between the anode of said first diode and said auxiliary d-c voltage source.

* * * * *